(12) United States Patent
Kakegawa

(10) Patent No.: US 8,133,323 B2
(45) Date of Patent: Mar. 13, 2012

(54) FILM FORMING APPARATUS AND METHOD, GAS SUPPLY DEVICE AND STORAGE MEDIUM

(75) Inventor: Takashi Kakegawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 67 days.

(21) Appl. No.: 12/340,058

(22) Filed: Dec. 19, 2008

(65) Prior Publication Data

US 2009/0104351 A1 Apr. 23, 2009

Related U.S. Application Data

(63) Continuation of application No. PCT/JP2007/62328, filed on Jun. 19, 2007.

(30) Foreign Application Priority Data

Jun. 20, 2006 (JP) ................................. 2006-170585

(51) Int. Cl.
- *C23C 16/455* (2006.01)
- *C23C 16/52* (2006.01)
- *C23F 1/00* (2006.01)
- *H01L 21/306* (2006.01)
- *C23C 16/06* (2006.01)
- *C23C 16/22* (2006.01)

(52) U.S. Cl. ............ 118/724; 118/715; 156/345.37; 156/345.33; 156/345.34

(58) Field of Classification Search ........ 118/724, 118/715; 156/345.37, 345.33, 345.34
See application file for complete search history.

(56) References Cited

U.S. PATENT DOCUMENTS

| 4,590,042 | A | * | 5/1986 | Drage | 422/186.06 |
| 4,793,975 | A | * | 12/1988 | Drage | 422/186.05 |
| 5,422,139 | A | * | 6/1995 | Fischer | 427/248.1 |
| 5,647,945 | A | * | 7/1997 | Matsuse et al. | 156/345.38 |
| 5,935,337 | A | * | 8/1999 | Takeuchi et al. | 118/724 |
| 5,950,925 | A | * | 9/1999 | Fukunaga et al. | 239/132.3 |
| 5,951,772 | A | * | 9/1999 | Matsuse et al. | 118/723 R |
| 6,190,732 | B1 | * | 2/2001 | Omstead et al. | 427/248.1 |
| 6,453,992 | B1 | * | 9/2002 | Kim | 165/206 |
| 6,537,418 | B1 | * | 3/2003 | Muller et al. | 156/345.34 |

(Continued)

FOREIGN PATENT DOCUMENTS

JP 2002-53963 2/2002

(Continued)

OTHER PUBLICATIONS

Office Action issued Oct. 27, 2010, in Korean Patent Application No. 10-2008-7030964, filed Dec. 19, 2008.

*Primary Examiner* — Rudy Zervigon

(74) *Attorney, Agent, or Firm* — Oblon, Spivak, McClelland, Maier & Neustadt, L.L.P.

(57) ABSTRACT

A film forming apparatus is provided with a chamber which defines a processing space for performing a film forming process to a substrate a stage arranged in the chamber for mounting the substrate thereon; a substrate heating unit arranged on the stage for heating the substrate; a shower head which is arranged to face the stage and has many gas injecting holes; a gas supply unit for supplying cooling unit arranged above the shower head for cooling the shower head; and a shower head heating unit arranged above the cooling unit for heating the shower head through the cooling unit.

20 Claims, 15 Drawing Sheets

U.S. PATENT DOCUMENTS

| | | | |
|---|---|---|---|
| 6,700,089 B1 * | 3/2004 | Hirooka | 219/121.4 |
| 6,821,910 B2 * | 11/2004 | Adomaitis et al. | 438/758 |
| 6,905,079 B2 * | 6/2005 | Kuwada et al. | 239/13 |
| 7,159,537 B2 * | 1/2007 | Wickramanayaka et al. | 118/723 E |
| 7,273,526 B2 * | 9/2007 | Shinriki et al. | 118/715 |
| 7,337,745 B1 * | 3/2008 | Komino et al. | 118/723 E |
| 7,712,434 B2 * | 5/2010 | Dhindsa et al. | 118/723 E |
| 7,718,030 B2 * | 5/2010 | Funk et al. | 156/345.29 |
| 2002/0007790 A1 | 1/2002 | Park | |
| 2003/0097987 A1 * | 5/2003 | Fukuda | 118/723 E |
| 2003/0143839 A1 * | 7/2003 | Raaijmakers et al. | 438/633 |
| 2004/0099213 A1 * | 5/2004 | Adomaitis et al. | 118/715 |
| 2005/0000423 A1 | 1/2005 | Kasai | |
| 2005/0208217 A1 * | 9/2005 | Shinriki et al. | 427/248.1 |
| 2005/0229848 A1 * | 10/2005 | Shinriki et al. | 118/715 |
| 2006/0137607 A1 * | 6/2006 | Seo et al. | 118/715 |
| 2007/0022954 A1 * | 2/2007 | Iizuka et al. | 118/724 |
| 2007/0026540 A1 * | 2/2007 | Nooten et al. | 438/5 |
| 2007/0068625 A1 * | 3/2007 | Funk et al. | 156/345.29 |
| 2007/0095284 A1 | 5/2007 | Iizuka et al. | |
| 2007/0131168 A1 * | 6/2007 | Gomi et al. | 118/715 |
| 2007/0137575 A1 | 6/2007 | Ohmi et al. | |

FOREIGN PATENT DOCUMENTS

| | | |
|---|---|---|
| JP | 2002-327274 | 11/2002 |
| JP | 2004-100001 | 4/2004 |
| KR | 10-2006-0006133 | 1/2006 |
| KR | 10-2006-0064067 | 6/2006 |
| WO | WO 2005/045913 A1 | 5/2005 |
| WO | WO 2005/119749 A1 | 12/2005 |

* cited by examiner

FILM FORMING APPARATUS AND METHOD, GAS SUPPLY DEVICE AND STORAGE MEDIUM

This application is a Continuation Application of PCT International Application No. PCT/JP2007/062328 filed on Jun. 19, 2007, which designated the United States.

FIELD OF THE INVENTION

The present invention relates to a film forming apparatus and method for forming a predetermined thin film on a substrate by a chemical vapor deposition (CVD) method.

BACKGROUND OF THE INVENTION

In a semiconductor manufacturing process, in order to fill holes between wirings formed on a semiconductor wafer as a substrate to be processed (hereinafter, referred to as a "wafer"), or in order to provide a barrier layer, a thin film is formed by depositing a metal such as Ti, Al, Cu or the like or a metal compound such as WSi, TiN, TiSi or the like. Such thin film of the metal or metal compound is formed by means of a CVD method which has a better buriability compared to a physical vapor deposition (PVD) method.

A CVD film forming apparatus includes: a wafer stage provided in a chamber and having a heater embedded therein; and a shower head, provided above and opposite to the stage, for injecting a processing gas. A processing space in the chamber is set to a predetermined vacuum level. A wafer on the stage is heated to a predetermined temperature, while the processing gas is continuously supplied from the shower head into the chamber. Accordingly, a chemical reaction occurs on a wafer surface, and a reaction product is deposited on the wafer surface. As a consequence, a film is formed.

When a TiN film is formed on a wafer by using, e.g., $TiCl_4$ and $NH_3$, as processing gases, a portion of the shower head which comes into contact with the processing space needs to be temperature controlled in order to prevent adhesion of a lower-order of $TiCl_x$ generated from the processing gases to the wafer. Therefore, a heater may be provided on the side of the shower head.

Meanwhile, in order to form a high-quality thin film while ensuring excellent adhesivity and step coverage, a film forming process may be performed by using a technique referred to as "SFD" (sequential flow deposition) which is one of the CVD methods. The SFD is a method for forming a thin film having a desired thickness by laminating a molecular layer on a wafer by repeating cycles of supplying a processing gas containing a film forming material into the processing space of the chamber intermittently.

When the film forming process is performed by the SFD, energy needs to be supplied to the processing gas in a short period of time in order to facilitate intermittent chemical reaction. Therefore, compared to the conventional CVD, a temperature of the heater provided at the stage is set to a higher level.

However, when the temperature of the heater of the stage increases, a temperature of a shower head surface which comes in contact with the processing space increases by heat radiated from the heater of the stage during the film forming process. As a result, a film of the processing gas is easily formed on the shower head surface.

In that state, if the film is adhered to the shower head, the film absorbs heat and, thus, the temperature of the shower head increases further. Moreover, due to the temperature increase, the film is more easily adhered to the shower head, and the temperature of the shower head increases even further, leading to a vicious cycle. As a result, it is not possible to perform the temperature control by the heater provided on the side of the shower head. That is, the temperature control of the shower head which is required in the film forming process may not be performed. Further, when the shower head is made of nickel, if the temperature of the shower head cannot be controlled and thus is beyond a tolerance range, a nickel compound is generated in the shower head, which may cause generation of particles.

Here, Japanese Patent Laid-open Application No. 2002-327274 (particularly, paragraph [0038], FIG. 1) describes a film forming apparatus including a heating unit provided above a shower head and a cooling unit provided above the heating unit. However, in the above-described cooling unit, when the temperature control is required for suppressing a temperature increase of the shower head due to heat from a processing space as in the SFD, the cooling operation is applied from above the heating unit without being directly applied to the shower head, thus deteriorating the cooling responsiveness. That is, the temperature of the shower head surface facing the processing space cannot be controlled with high accuracy.

SUMMARY OF THE INVENTION

The present invention has been conceived to solve the problems described above effectively. In view of the above, the present invention provides a film forming apparatus and method capable of controlling a temperature of a surface of a shower head which faces a processing space to a set temperature with high accuracy.

In accordance with an aspect of the present invention, there is provided a film forming apparatus including: a chamber which defines a processing space for performing a film forming process to a substrate; a stage arranged in the chamber for mounting the substrate thereon; a substrate heating unit arranged on the stage for heating the substrate; a shower head which is arranged to face the stage and has a plurality of gas injecting holes; a gas supply unit for supplying a processing gas into the chamber through the shower head; a cooling unit arranged above the shower head for cooling the shower head; and a shower head heating unit arranged above the cooling unit for heating the shower head through the cooling unit.

In accordance with the above characteristics, the cooling operation of the cooling unit is directly applied to the shower head, so that responsiveness in cooling is good. That is, the temperature of the shower head surface facing the processing space can be controlled to a set temperature with high accuracy. As a result, a uniform film forming process can be performed between substrates.

It is preferable that the cooling unit includes a plurality of cooling fins and a cooling gas supply channel for supplying cooling gas to the corresponding cooling fins.

Further, each of the cooling fins may be raised and has a horizontally elongated plate shape. The cooling fins may be arranged in parallel and the cooling gas supply channel may have a gas discharge holes which open to allow cooling gas to pass from one end to the other end of a horizontally extending gap between the cooling fins.

It is also preferable that the cooling unit and the shower head heating unit are accommodated in a housing having a gas exhaust port.

Further, the shower head may include a gas diffusion space communicating with the gas injecting holes, and a plurality of post portions for transferring heat between an upper side and a lower side of the shower head are disposed in the gas diffusion space.

The film forming apparatus may further includes a temperature detecting unit for detecting a temperature of a bottom surface of the shower head and a control unit for controlling the shower head heating unit based on a detected temperature value of the temperature detecting unit.

It is preferable that the gas supply unit may supply a first and a second processing gas into a processing space simultaneously or separately in a plurality of cycles. In this case, for example, the first processing gas may be titanium compound gas, and the second processing gas may be ammonia gas.

In accordance with a second aspect of the present invention, there is provided a gas supply device for use in a film forming apparatus including a chamber which defines a processing space for performing film forming process to a substrate and a stage arranged in the chamber for mounting the substrate thereon.

The gas supply device includes: a shower head which is arranged to face the stage and has a plurality of gas injecting holes; a cooling unit arranged above the shower head for cooling the shower head; and a shower head heating unit arranged above the cooling unit for heating the shower head through the cooling unit.

In accordance with the above characteristics, the cooling operation of the cooling unit is directly applied to the shower head, so that responsiveness in cooling is good. That is, the temperature of the shower head surface facing the processing space can be controlled to a set temperature with high accuracy. As a result, a uniform film forming process can be performed between substrates.

In accordance with a third aspect of the present invention, there is provided a film forming method for performing a film forming process on a substrate by using a film forming apparatus including a chamber which defines a processing space for performing film forming process to a substrate, a stage arranged in the chamber for mounting the substrate thereon, a substrate heating unit arranged on the stage for heating the substrate, a shower head which is arranged to face the stage and has a plurality of gas injecting holes, a gas supply unit for supplying a processing gas into the chamber through the shower head, a cooling unit arranged above the shower head for cooling the shower head, and a shower head heating unit arranged above the cooling unit for heating the shower head through the cooling unit.

The film forming method including: mounting the substrate on the stage; heating the substrate by the substrate heating unit; supplying the processing gas into the chamber via the shower head by the gas supply unit; cooling the shower head by the cooling unit provided above the shower head; and heating the shower head via the cooling unit by the shower head heating unit provided above the cooling unit.

In accordance with a fourth aspect of the present invention, there is provided a computer-readable storage medium which stores therein a computer program for executing the film forming method in accordance with the third aspect of the present invention in a computer.

Further, as for a substrate, there may be used a semiconductor wafer, an LCD substrate, a glass substrate, a ceramic substrate or the like.

DETAILED DESCRIPTION OF THE EMBODIMENT

Figure 1:
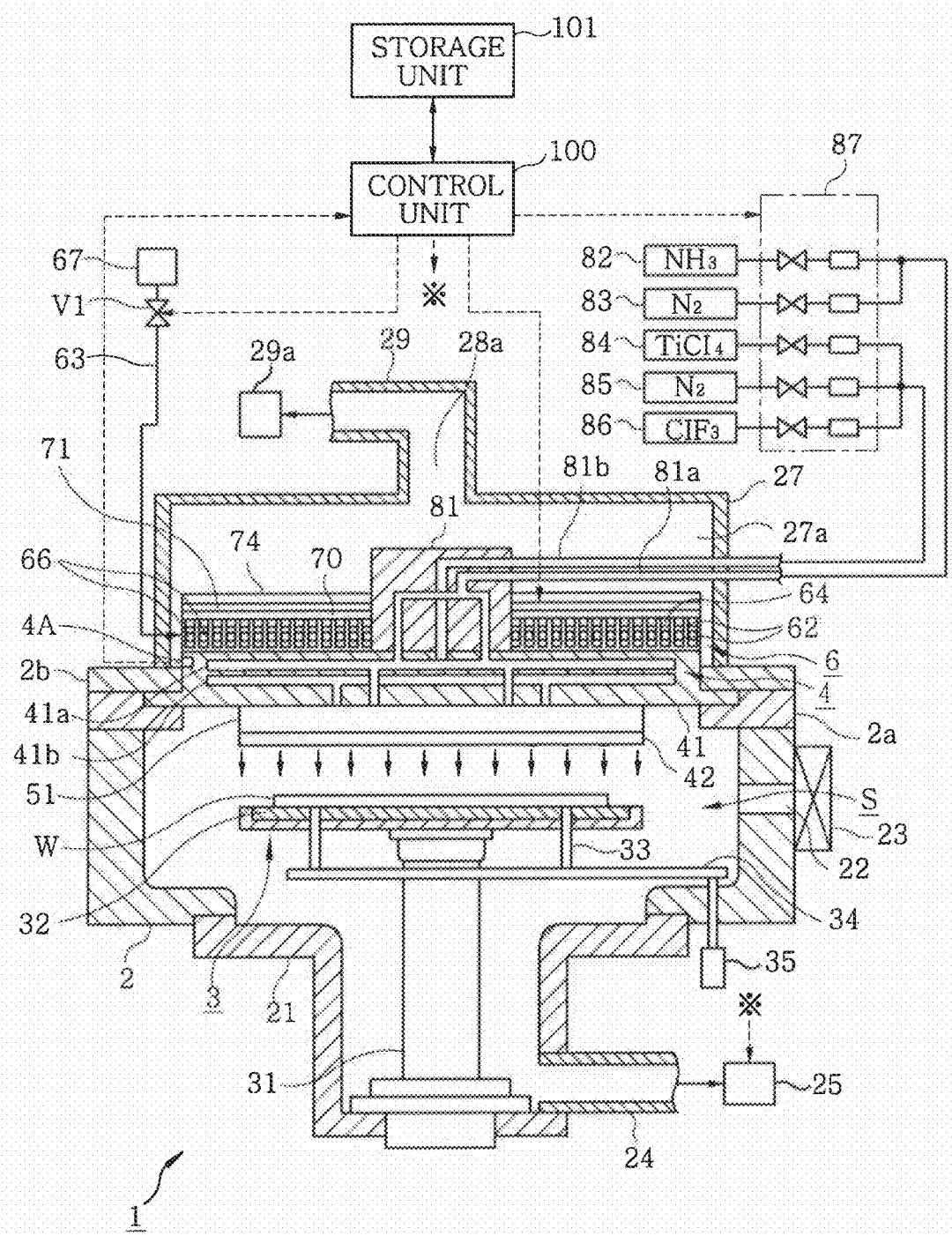
FIG. 1 shows a schematic cross sectional view of a film forming apparatus in accordance with an embodiment of the present invention.

FIG. 1 shows a schematic cross sectional view of a film forming apparatus in accordance with an embodiment of the present invention. A film forming apparatus 1 of the present embodiment is an apparatus for forming a TiN thin film on a wafer W as a substrate by a SFD method.

The corresponding film forming apparatus 1 includes an airtightly sealed chamber 2 of a substantially cylindrical shape. A cylindrical stage holding member 21 (having a diameter smaller than that of the chamber 2) that protrudes downward is attached at a center bottom portion of the chamber 2 via a sealing ring. A processing space S is defined (surrounded) by the chamber 2. The chamber 2 and the stage holding member 21 are provided with heating mechanisms (not shown), and the heating mechanisms are heated to predetermined temperatures by electric power supplied from a power supply (not shown).

Provided on a sidewall of the chamber 2 is a loading/unloading port 22 for loading and unloading the wafer W. The loading/unloading port 22 is opened and closed by a gate valve 23.

A gas exhaust line 24 is connected to a sidewall of the stage holding member 21, and is also connected to a gas exhaust unit 25. The gas exhaust unit 25 operates in accordance with a control signal from a control unit 100 to be described later. Accordingly, the inside of the chamber 2 is depressurized to a predetermined vacuum level.

The chamber 2 has therein a stage 3 as a mounting table for horizontally mounting thereon a wafer W as a substrate. The stage 3 is supported by a cylindrical supporting member 31. A lower portion of the supporting member 31 is attached to the stage holding member 21 via a sealing ring (not shown).

A wafer heater 32 is embedded in the stage 3. The wafer heater 32 heats the wafer W to a predetermined temperature by electric power supplied from a power supply (not shown).

The stage 3 is provided with three wafer supporting pins 33 (only two are shown) for supporting and vertically moving the wafer W. The wafer supporting pins 33 can be protruded from or retracted into the top surface of the stage 3. The wafer supporting pins 33 are fixed to a supporting plate 34, so that they are moved up and down together with the supporting plate 34 raised and lowered by vertically moving a driving mechanism 35 including, e.g., a motor.

Figure 2:
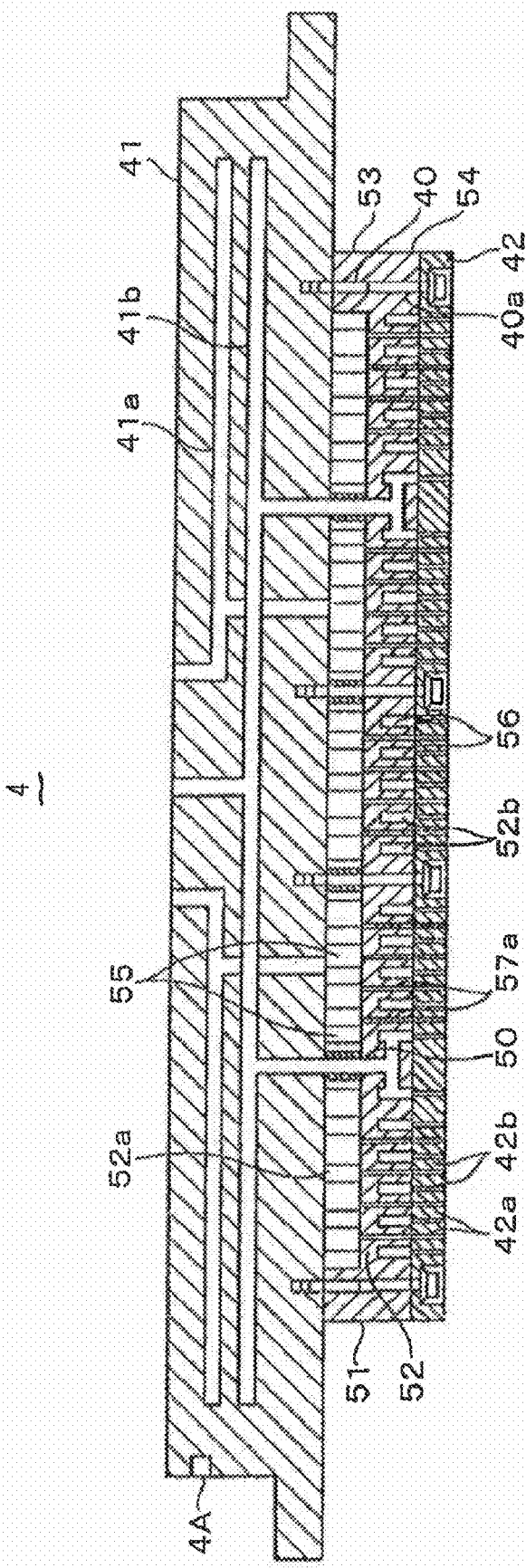
FIG. 2 describes an enlarged cross sectional view of a shower head of the film forming apparatus shown in FIG. 1.

A supporting member 2a is provided at an upper portion of the chamber 2. A shower head 4 is provided to face the stage 3 via the supporting member 2a. FIG. 2 is a vertical cross sectional view of the shower head 4. Hereinafter, the configuration of the shower head 4 will be explained with reference to FIG. 2. The shower head 4 includes a base portion 41, a spacer unit 51 and a shower plate 42. The spacer unit 51 is provided at a central bottom surface of the base portion 41, and the shower plate 42 is provided on a bottom surface of the spacer unit 51. A reference numeral 40 indicates screws for fixing the spacer unit 51 and the shower plate 42 to the base portion 41, and a reference numeral 40a represents screw holes.

The base portion 41 is formed in a flat circular shape, and a flange portion is disposed at an outer side of a lower portion thereof. The flange portion is supported by the supporting member 2a. Formed in the base portion 41 are a first gas channel 41a and a second gas channel 41b which are partitioned from each other.

Provided at an upper part of the base portion 41 above the flange portion thereof is a sensor 4A as a detection unit for detecting a temperature of the corresponding upper part of the base portion 41. The temperature detecting sensor 4A transmits to the control unit 100 an electrical signal corresponding to the detected temperature. Further, since the base portion 41 is connected to the shower plate 42 via the spacer unit 51, the temperature detected by the temperature detecting sensor 4A corresponds to a temperature of the surface of the shower head 4 which faces the processing space S.

Figure 3:
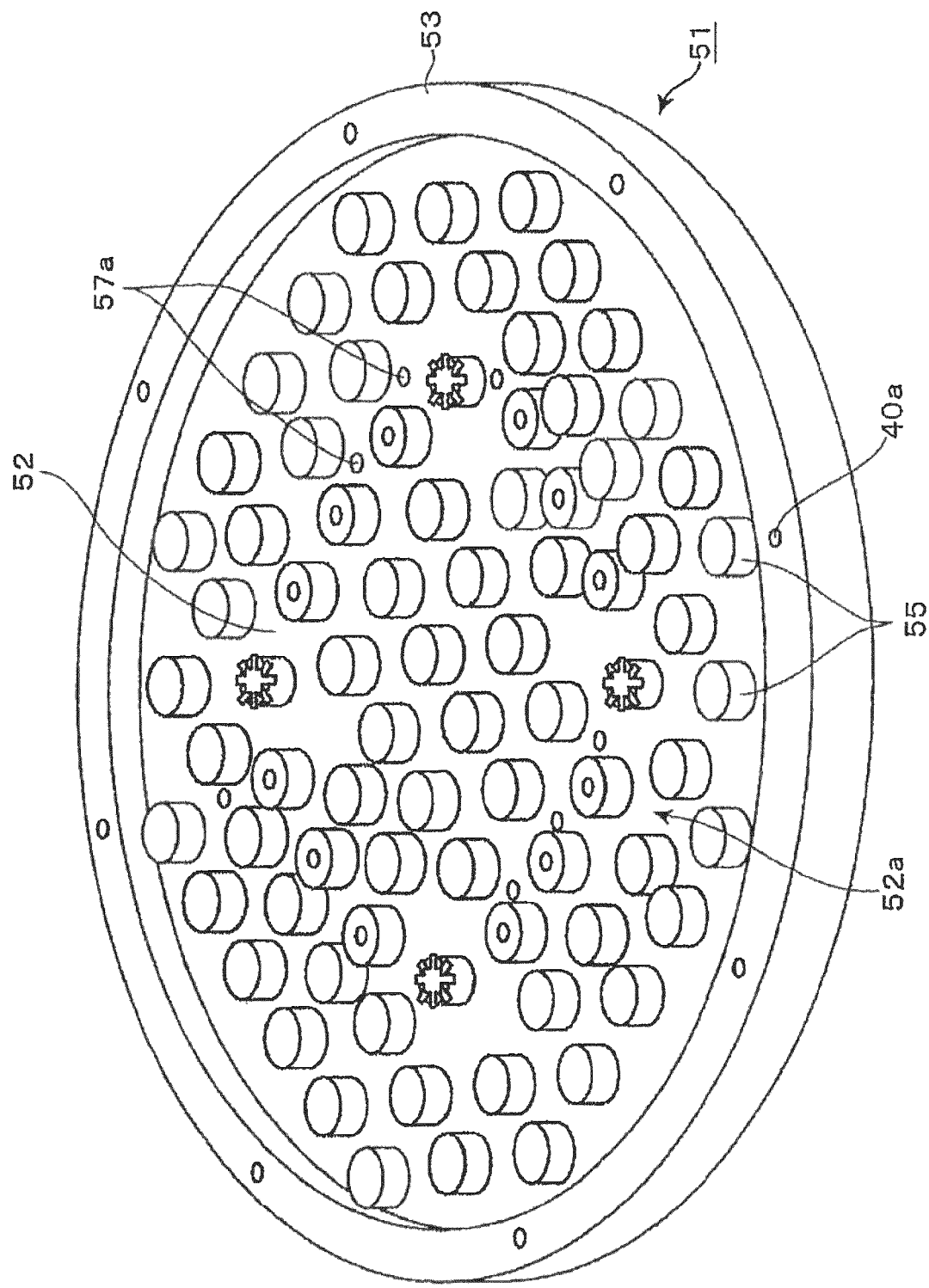
FIG. 3 provides a perspective view of a top surface of a spacer unit forming the shower head shown in FIG. 2.
Figure 4:
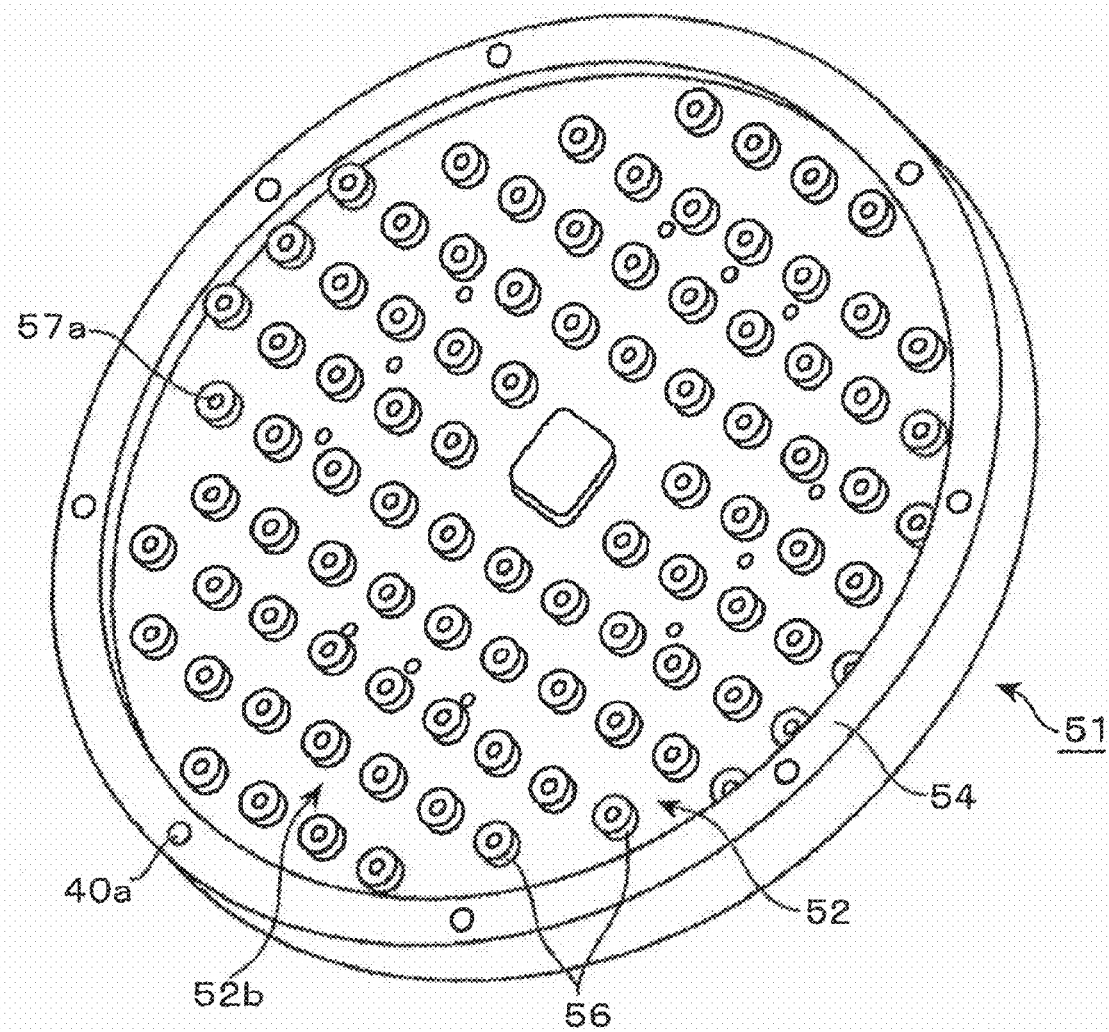
FIG. 4 represents a perspective view of a bottom surface of the spacer unit shown in FIG. 3.

FIG. 3 provides a perspective view of a top surface of the spacer unit forming the shower head of FIG. 2, and FIG. 4 represents a perspective view of a bottom surface of the spacer unit of FIG. 3. The spacer unit 51 has a circular plate portion 52 and peripheral projecting portions 53 and 54 projecting upward and downward along the circumference of the circular plate portion 52. The top surface of the peripheral projecting portion 53 is firmly adhered to the base portion 41, and the bottom surface of the peripheral projecting portion 54 is firmly adhered to the shower plate 42. A space surrounded by the peripheral projecting portion 53, the circular plate portion 52 and the base portion 41 is configured as a first gas diffusion space 52a. Moreover, a space surrounded by the peripheral projecting portion 54, the circular plate portion 52 and the shower plate 42 is configured as a second gas diffusion space 52b.

The first gas diffusion space 52a communicates with the first gas channel 41a of the base portion 41. Although it is not illustrated in FIGS. 3 and 4, the second gas channel 41b of the base portion 41 communicate with the second gas diffusion space 52b via intermediate paths 50 formed in a thickness direction of the circular plate portion 52, as illustrated in FIG. 2.

As shown in FIG. 3, a plurality of upwardly elongated bosses 55 as post portions spaced from each other are arranged in an island pattern on the top surface side of the circular plate portion 52. The top surfaces (leading end surfaces) of the bosses 55 contact with the bottom surface of the base portion 41. When the base portion 41 is cooled by a cooling member 6 to be described later, each of the bosses 55 transmits cold (cold heat) of the base portion 41 to the spacer unit 51 effectively. Hence, the temperatures of the surface of the corresponding spacer unit 51 and the surface of the shower plate 42 connected to the corresponding spacer unit 51 are controlled with high accuracy.

In the present embodiment, the spacer unit 51 has a diameter of about 340 mm. Further, a total area where the spacer unit 51 contacts with the base portion 41 is about 385 cm$^2$. This total area occupies about 42% of an area of the spacer unit 51 projected onto the base portion 41.

As illustrated in FIG. 4, a plurality of downwardly elongated protrusions (bosses) 56 spaced from each other are arranged on the entire bottom surface of the circular plate portion 52. The end surfaces of the bosses 56 contact with the top surface of the shower plate 42. Further, gas inlet holes 57a are formed to penetrate the bosses 56 and the circular plate portion 52 in a thickness direction thereof. The gas inlet holes 57a communicate with the first gas diffusion space 52a.

For convenience, only a few of the gas inlet holes 57a are illustrated in FIG. 3. In reality, however, a plurality of them are provided to correspond to the bosses 56. Since FIGS. 3 and 4 only schematically illustrate the top surface and the bottom surface of the circular plate portion, it is possible to appropriately modify a size of the bosses 55 and 56, a distance between the bosses, and the number of the bosses 55 and 56.

The shower plate 42 is a member formed in a circular plate shape, and a plurality of gas injecting holes are formed to penetrate therethrough in a thickness direction. For example, the gas injecting holes are arranged in a matrix pattern over the entire shower plate 42. These gas injecting holes include first gas injecting holes 42a communicating with the first gas diffusion space 52a and second gas injecting holes 42b communicating with the second gas diffusion space 52b. The first and the second gas injecting holes 42a and 42b are arranged alternately.

A gas supplied to the first gas channel 41a is injected in a shower shape through the gas injecting holes 42a into the processing space S via the first gas diffusion space 52a and the gas inlet holes 57a, and then is supplied to the wafer W on the stage 3. Further, a gas supplied to the second gas channel 41b is injected in a shower shape through the gas injecting holes 42b into the processing space S via the intermediate paths 50 and the second gas diffusion space 52b, and then is supplied to the wafer W on the stage 3. In other words, the gas supplied to the first gas channel 41*a* and the gas supplied to the second gas channel 41*b* are not mixed with each other in the shower head 4.

Figure 5:
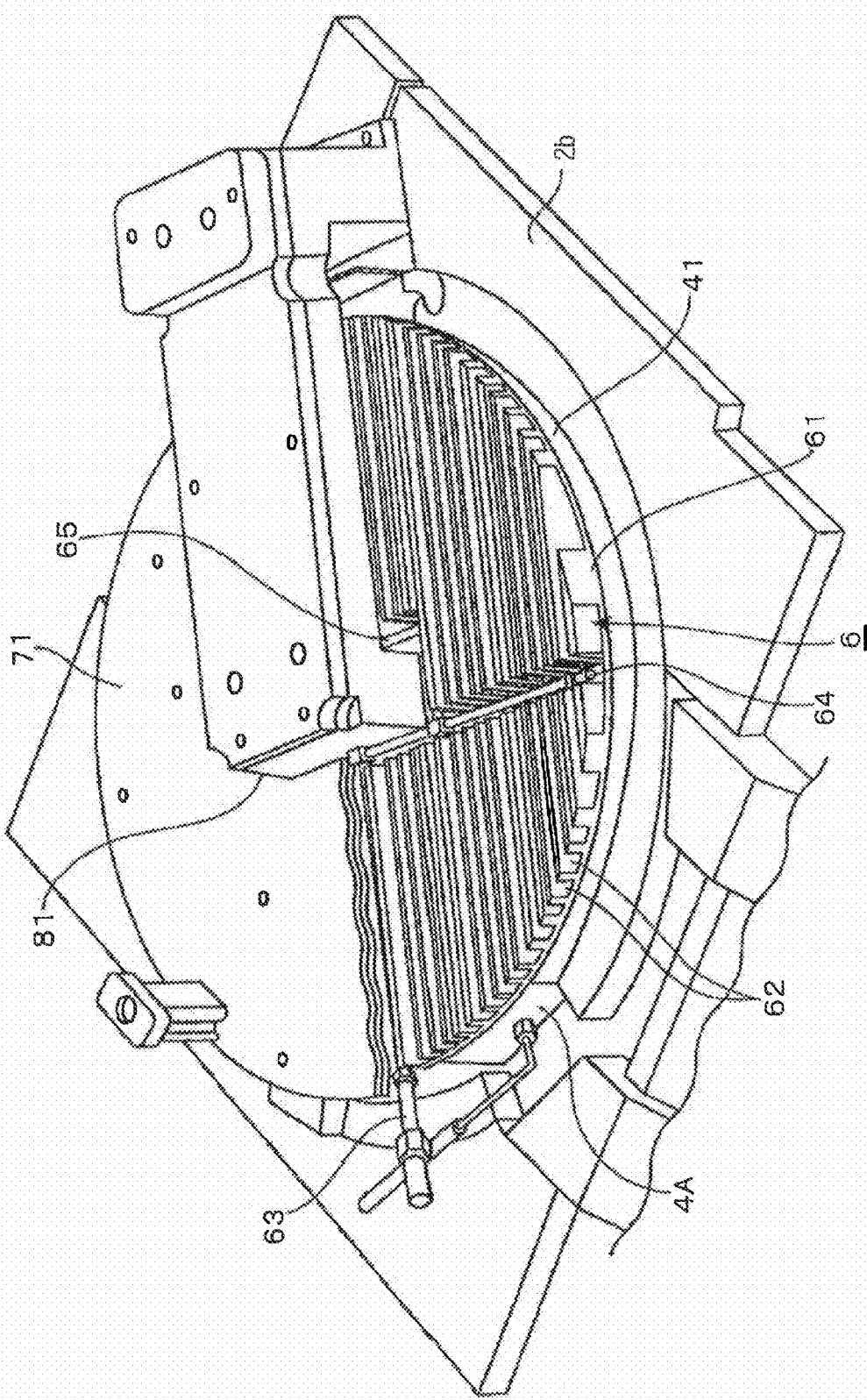
FIG. 5 offers a perspective view of a configuration of components provided at an upper portion of the shower head shown in FIG. 2.

FIG. 5 is a perspective view showing a configuration of an upper portion of the shower head 4. As shown in FIG. 5, the cooling member 6 made of, e.g., aluminum, is provided on the base portion 41.

Figure 6:
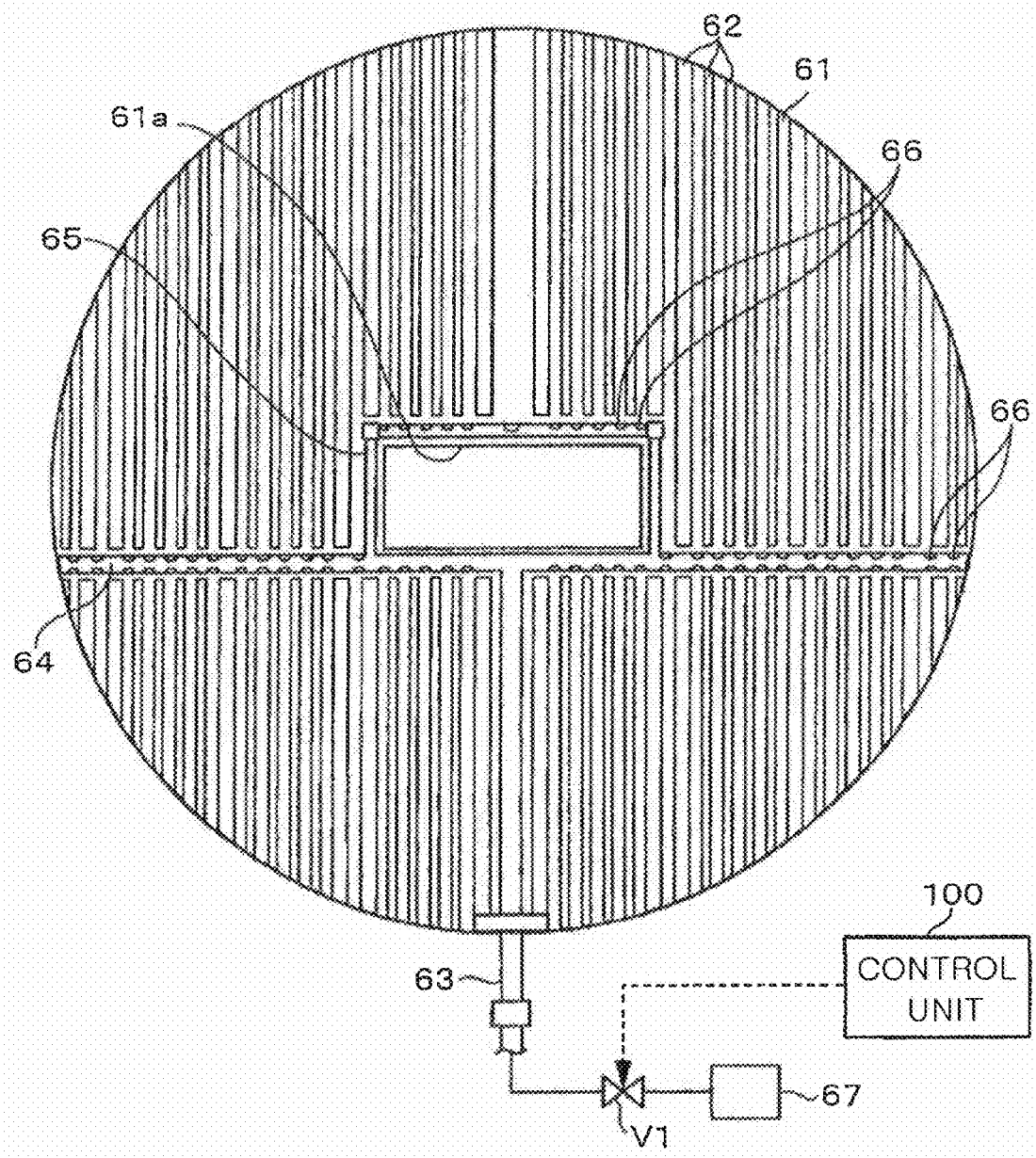
FIG. 6 presents a top view of a cooling member provided above the shower head shown in FIG. 2.

The top surface of the base portion 41 and the bottom surface of the cooling member 6 are fixed by means of a screw (not shown) or the like so as to be firmly adhered to each other over the entire surfaces. Further, in order to achieve effective heat conductance, a member made of a material having high thermal conductivity such as carbon graphite, metal, ceramic or the like may be provided between the base portion 41 and the cooling member 6. FIG. 6 is a top view of the cooling member 6. The cooling member 6 includes a circular plate-shaped base portion 61 and a plurality of cooling fins 62 raised on the top surface of the base portion 61. Each of the cooling fins 62 has a horizontally elongated plate shape, and the cooling fins 62 are arranged in parallel.

The central portion of the base portion 61 serves as a connecting region of a gas supply block 81 to be described later. An opening 61*a* of a rectangular shape is formed at the central portion of the base portion 61 in a thickness direction of the base portion 61. The gas supply block 81 to be described later is connected to the shower head 4 via the opening 61*a*.

As depicted in FIG. 6, a cooling gas inlet line 63 is provided on the base portion 61 from so as to be extended from one peripheral end of the base portion 61 toward the center thereof. The cooling gas inlet line 63 is connected to central portions of cooling gas discharge lines 64 extending on the base portion 61 along a diameter thereof. Further, a side line 65 is provided on the base portion 61 to surround the connecting region of the gas supply block 81. Both end portions of the side line 65 are connected to the cooling gas discharge lines 64.

The cooling gas discharge line 64 and the side line 65 are provided with gas jetting holes 66 (cooling gas discharge holes) spaced from each other along a longitudinal direction of the cooling fins 62 in horizontally elongated gaps between the cooling fins 62. Moreover, connected to the cooling gas inlet line 63 is a cooling gas supply source 67 for storing cooling gas, e.g., dry air. A notation V1 in the drawing indicates a valve for controlling on and off of a supply of the cooling gas from the cooling gas supply source 67 to the cooling gas inlet line 63 in accordance with the electrical signal of the control unit 100.

Figure 7:
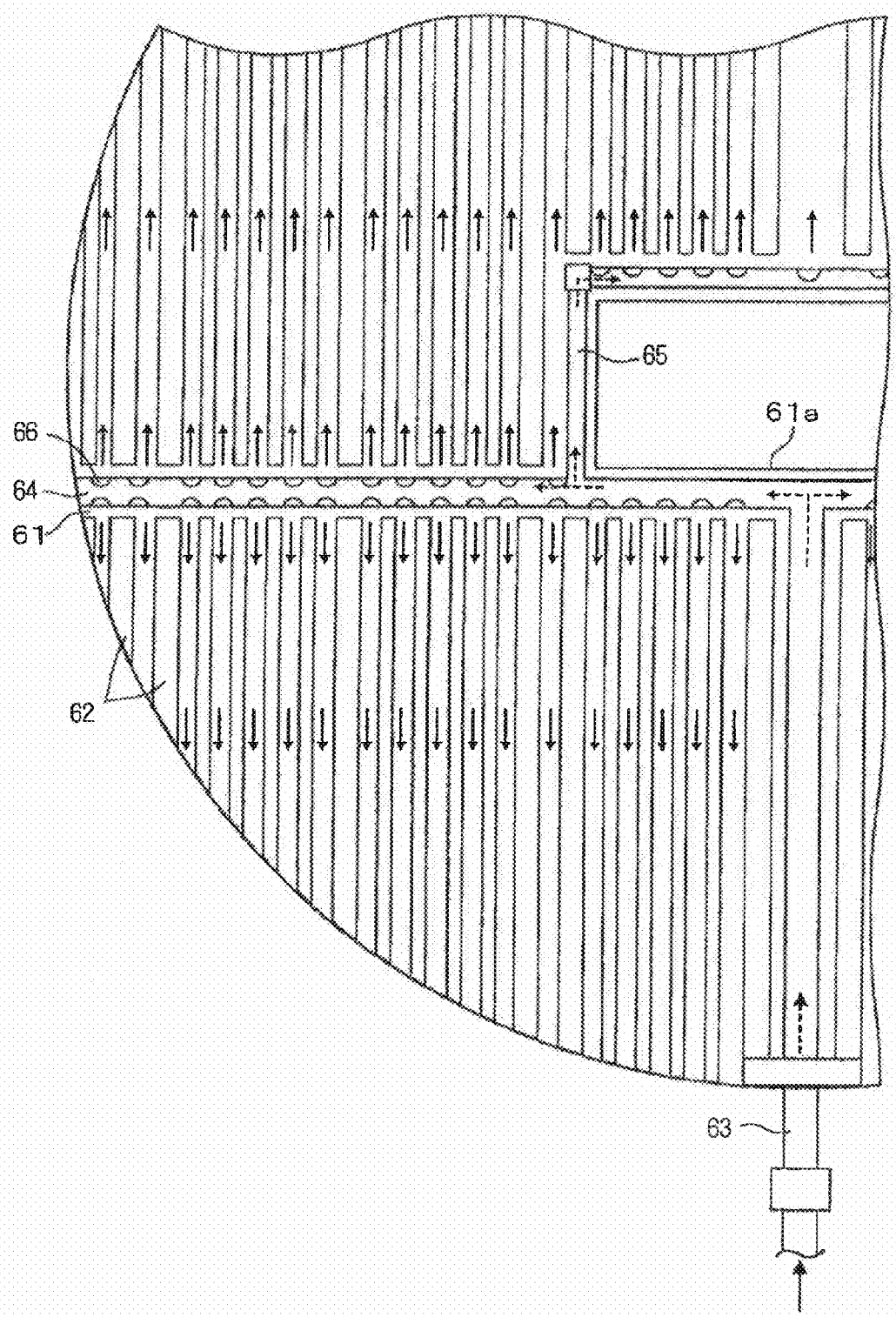
FIG. 7 is a top view for explaining a supply of cooling gas to the cooling member shown in FIG. 6.

When the valve V1 opens in accordance with the electrical signal of the control unit 100, the cooling gas is introduced at a predetermined flow rate from the cooling gas supply source 67 to the cooling gas discharge line 64 and the side line 65 via the cooling gas inlet line 63, and then is discharged through the cooling gas discharge holes 66, as shown in FIG. 7. The discharged cooling gas flows toward the peripheral portion of the cooling member 6 along the cooling fins 62, as indicated by arrows in the drawing. At this time, the cooling fins 62 and the surface of the base portion 61 are cooled while being exposed to the flow of the cooling gas. When the cooling member 6 is cooled, the shower head 4 adjacent thereto is cooled.

Moreover, the cooling unit defined in the claims includes the cooling member 6, the cooling gas inlet line 63, the cooling gas discharge lines 64, the side line 65 and the cooling gas supply source 67. Further, the cooling gas supply line includes the cooling gas inlet line 63, the cooling gas discharge lines 64 and the side line 65.

Figure 8:
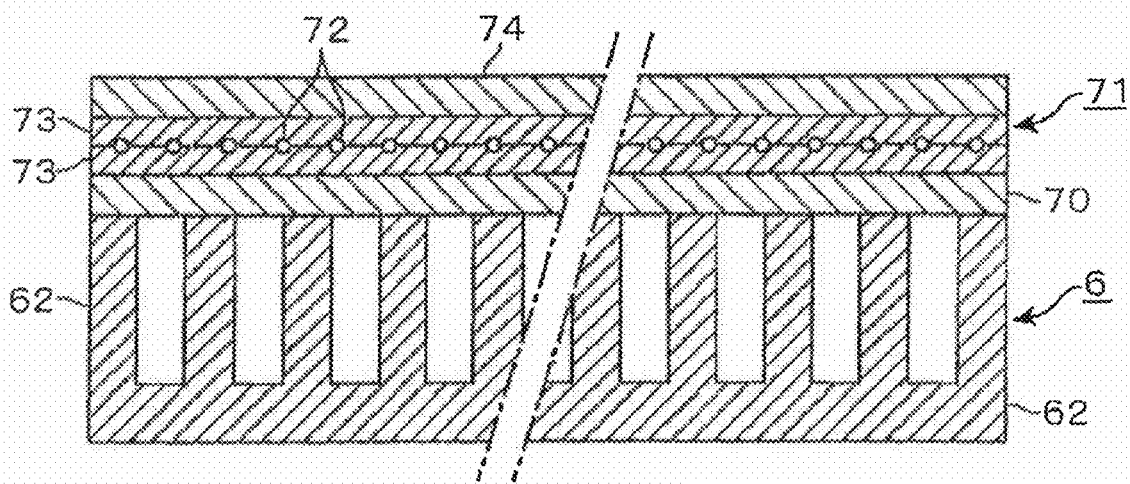
FIG. 8 provides a cross sectional view of a heater provided above the shower head shown in FIG. 2.

Furthermore, as shown in FIG. 8, a shower head heater 71 of a circular plate-shape as a shower head heating unit is provided on the cooling fins 62 via a plate-shaped member 70 made of aluminum. The shower head 4 can be heated by the heater 71 via the plate-shaped member 70 and the cooling member 6. The shower head heater 71 has a structure in which a heating resistance 72 is inserted between insulating rubber sheets 73. A reference numeral 74 in the drawing represents a plate-shaped member made of, e.g., aluminum. As for the shower head heater 71, there may be used one having a structure in which a heating resistance is buried in a metal plate. In view of reducing the weight of the apparatus, it is preferable to employ the above-described configuration.

The control unit 100 that receives the electrical signal from the temperature detecting sensor 4A of the shower head 4 adjusts the power of the heater 71 by sending the electrical signal to the shower head heater 71 so that the detected value of the temperature detecting sensor 4A is set to be, e.g., a predetermined temperature. The shower head heater 71 heats the shower head 4 via the cooling member 6 under the control of the control unit 100.

Due to the heat generated from the shower head heater 71 and the cold (cold heat) of the cooling member 6, it is possible to suppress the formation of a TiN film on the surface of the shower head 4 which faces the processing space S, and also possible to perform the temperature control so that a fine film forming process can be performed on the wafer W in the processing space S. In order to prevent a TiN film from being formed on the surface of the shower head 4, it is preferable to control the surface temperature to be lower than or equal to about 185° C.

The gas supply block 81 is provided on a central portion of the base portion 41. As illustrated in FIG. 1, the gas supply block 81 is provided with a first gas supply line 81*a* and a second gas supply line 81*b*.

One end of the first gas supply line 81*a* is connected to the first gas channel 41*a*. Further, the other end of the first gas supply line 81*a* is branched and connected to a gas supply source 82 for storing $NH_3$ gas as first processing gas and a gas supply source 83 for storing $N_2$ gas as carrier gas.

Moreover, one end of the second gas supply line 81*b* is connected to the second gas channel 41*b*. Further, the other end of the second gas supply line 81*b* is branched and connected to a gas supply source 84 for storing $TiCl_4$ gas as second processing gas, a gas supply source 85 for storing $N_2$ gas as carrier gas, and a gas supply source 86 for storing $ClF_3$ gas as cleaning gas.

The gas supply lines 81*a* and 81*b* are provided with a gas supply kit 87 including valves, mass flow controllers and the like. The gas supply kit 87 receives a control signal from the control unit 100 to be described later, and controls on and off of a supply of each processing gas. Further, the gas supply sources 82 to 86, the gas supply lines 81*a* and 81*b* and the gas supply kit 87 correspond to a gas supply unit defined in the claims.

Figure 9:
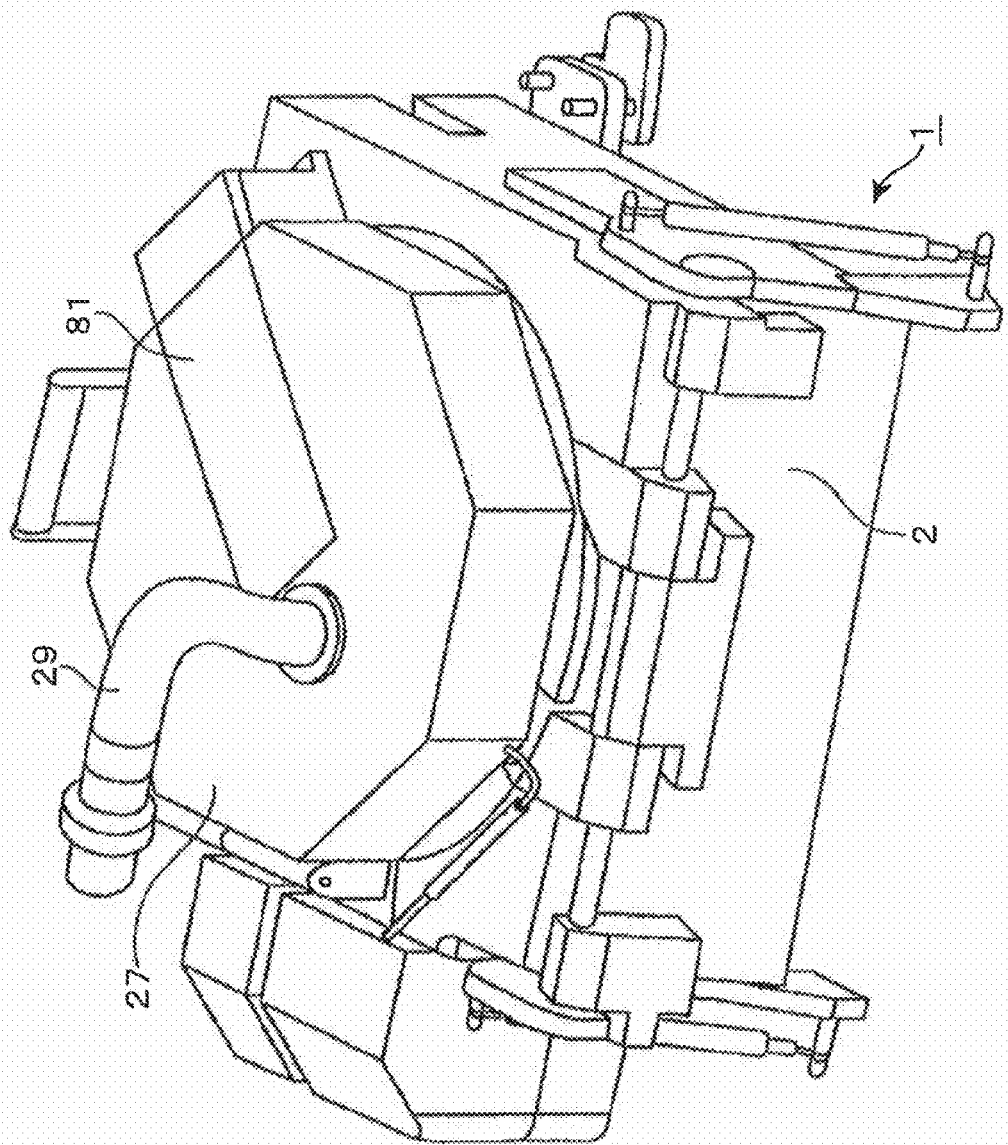
FIG. 9 depicts a perspective view of a configuration of components provided on a top surface side of the film forming apparatus shown in FIG. 1.

FIG. 9 is a perspective view illustrating the top surface of the film forming apparatus 1. As shown in FIGS. 1 and 9, a cover 27 as a housing accommodating therein the cooling member 6 and the shower head heater 71 is provided on the chamber 2 via a plate member 2*b*. A reference numeral 27*a* in FIG. 1 indicates a gas exhaust space surrounded by the cover 27. Provided at an upper portion of the cover 27 is a gas exhaust port 28*a* that opens to the gas exhaust space 27*a*. The gas exhaust port 28*a* is connected to one end of a gas exhaust line 29. The other end of the gas exhaust line 29 is connected to a gas exhaust unit 29*a*.

The cooling gas discharged from the cooling gas discharge holes 66 is used to cool the cooling member 6, and then is removed from the gas exhaust line 29 via the gas exhaust space 27a by the gas exhaust unit 29a.

The film forming apparatus 1 of the present embodiment includes the control unit 100 having, e.g., a computer. The control unit 100 is provided with a program, a memory, a data processing unit having a CPU or the like. The program includes a command to form a TiN film on a wafer W by allowing the control unit 100 to transmit electrical signals to respective parts of the film forming apparatus 1 so as to perform operations to be described later. Further, the memory has a space to which processing parameters (recipes) such as a processing pressure, a processing temperature, a processing time, a gas flow rate, an electric power and the like are input. When the CPU executes the respective commands of the program, these processing parameters are read out, and the control signals corresponding to the parameters are transmitted to the respective parts of the film forming apparatus 1.

The program (including a program related to a screen which is used in inputting the processing parameters) is stored in a storage unit 101 as a storage medium such as a flexible disk, a compact disk, an MO (magneto-optical) disk or the like, and is appropriately installed in the control unit 100.

Figure 10:
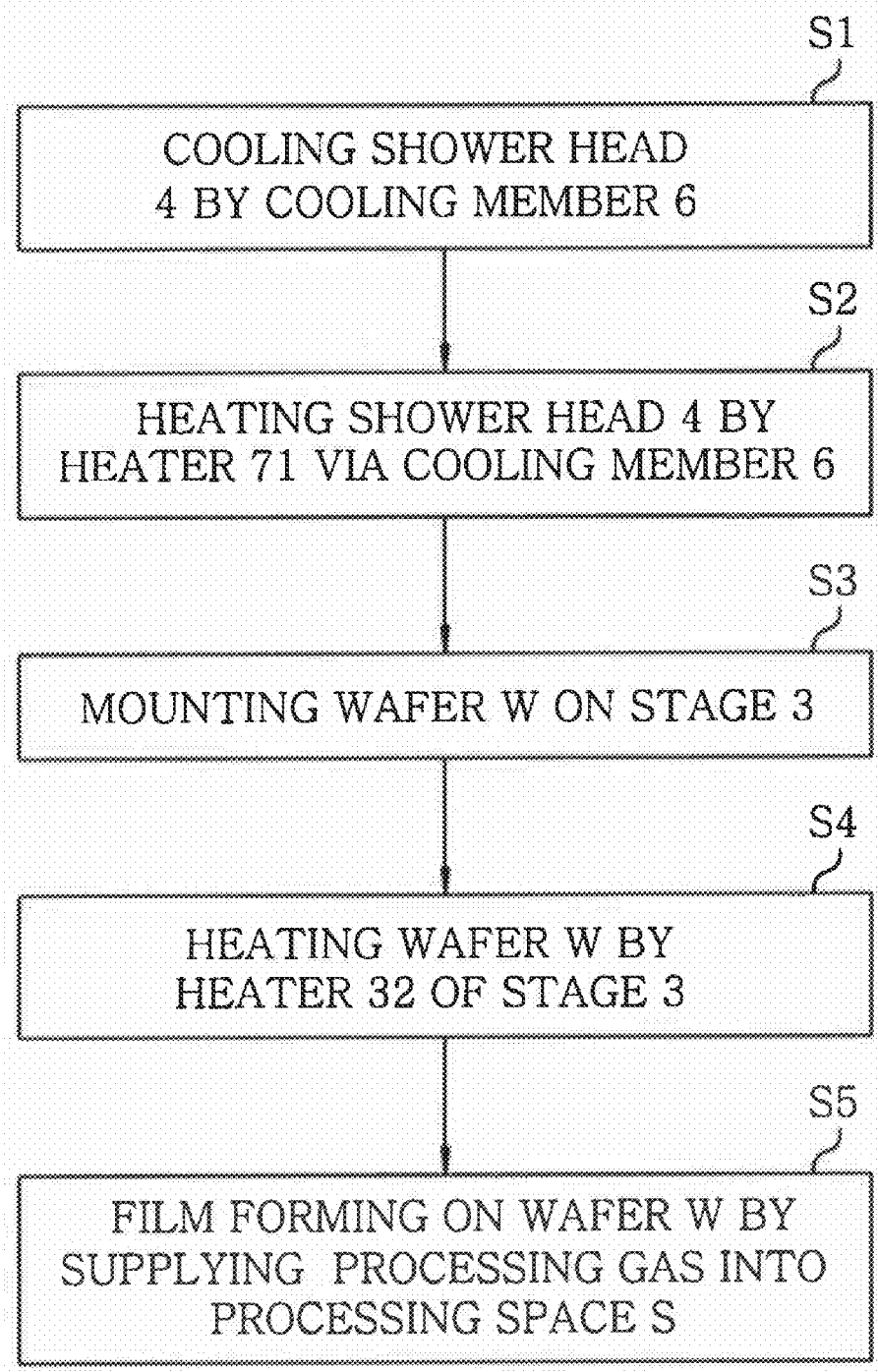
FIG. 10 is a flow chart illustrating an embodiment of a method for forming a film on a wafer.

Hereinafter, a film forming method for forming a TiN film on a surface of a wafer W by using the aforementioned film forming apparatus 1 will be described with reference to FIG. 10.

First of all, the inside of the chamber 2 is vacuum-evacuated by the gas exhaust unit 25. Further, $N_2$ gas as inert gas is supplied at a predetermined flow rate from the gas supply source 83 into the chamber 2. At this time, the stage 3 is heated to a predetermined temperature, e.g., about 600 to 700° C., by the wafer heater 32. Furthermore, a heater (not shown) of the chamber 2 is also heated, so that the inside of the chamber 2 is maintained at a predetermined temperature.

After the temperatures of the wafer heater 32 and the heater (not shown) of the chamber 2 increase, the cooling gas is supplied at a flow rate of, e.g., about 150 L/min, from the cooling gas supply source 67 to the cooling gas discharge line 64. This cooling gas is discharged from the cooling gas discharge holes 66, and cools the cooling member 6 (step S1). Further, the gas exhaust unit 29a operates substantially simultaneously with the supply of the cooling gas, so that the gas exhaust space 27a is exhausted.

After the supply of the cooling gas is initiated, the temperature of the shower head heater 71 increases, thus heating the shower head 4 via the cooling member 6. Here, the temperature of the shower head 4 is controlled so that the temperature detected by the temperature detecting sensor 4A can be maintained at a predetermined value, e.g., about 165° C. (step S2).

Next, the gate valve 23 opens, and the wafer W is loaded into the chamber 2 by a transfer arm (not shown). Further, the wafer W is mounted on the top surface of the stage 3 by the cooperation of the corresponding transfer arm and the wafer supporting pins 33, and the gate valve 23 is closed (step S3).

The wafer W mounted on the stage 3 is heated to a predetermined temperature (step S4).

Figure 11:
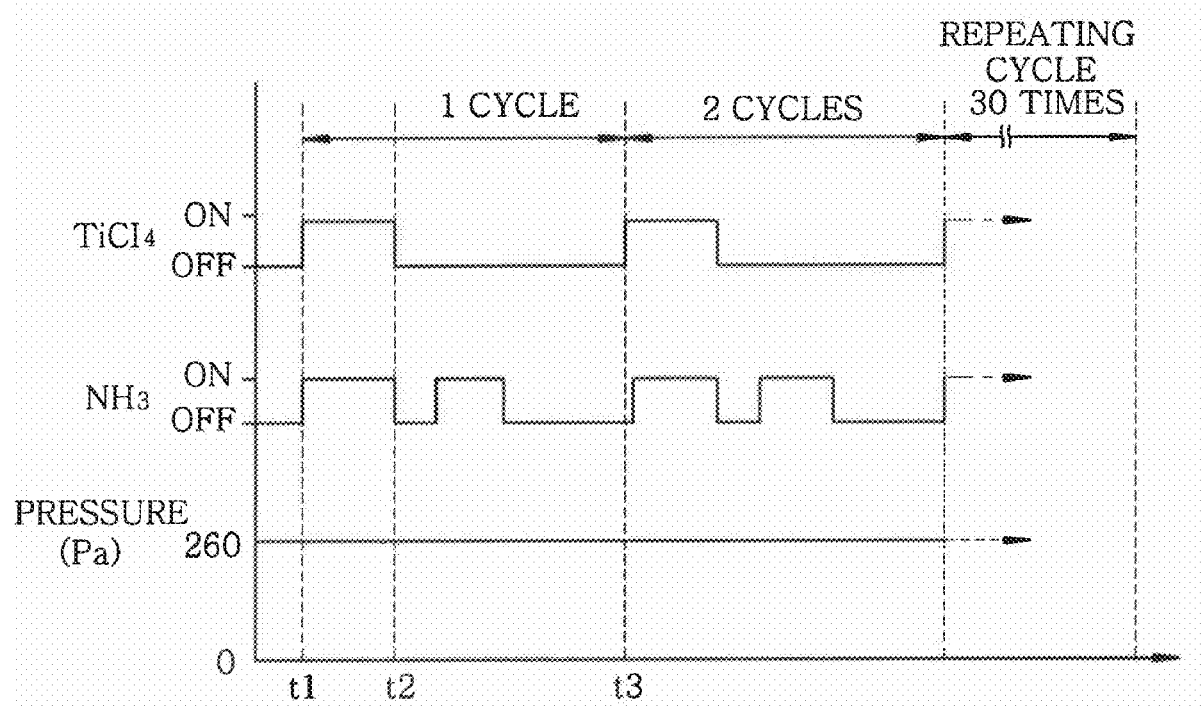
FIG. 11 offers an explanatory view for illustrating on and off of a supply of each processing gas during a film forming process of FIG. 10.

FIG. 11 is a graph, in a sequence of time, showing on and off of a gas supply and a pressure control during a process for forming a TiN thin film on a wafer. As shown in FIG. 11, the supply of both processing gases is ON at time t1 in a state where the temperature inside the chamber 2 is maintained at a predetermined temperature by heating the wafer W mounted on the stage 3 and the pressure inside the chamber 2 is maintained at, e.g., about 260 Pa. Further, $TiCl_4$ gas and $NH_3$ gas are supplied at respective flow rates from time t1 to time t2. $TiCl_4$ gas and $NH_3$ gas are used to form a TiN film on the surface of the wafer W by reaction of the following chemical reaction. (1) (step S5).

$$6TiCl_4 + 8NH_3 \rightarrow 6TiN + 24HCl + N_2 \qquad (1)$$

Next, the supply of $TiCl_4$ gas and $NH_3$ gas is stopped at time t2, and unreacted gas remaining in the chamber or a reaction by-product is removed. At this time, $N_2$ gas may be supplied as an example of purge gas. Thereafter, $NH_3$ gas is supplied at a predetermined flow rate for a predetermined period of time while stopping the supply of $TiCl_4$ gas (specifically, in addition to $NH_3$ gas, $N_2$ gas is supplied as carrier gas). Accordingly, remaining chlorine contained in the TiN film formed on the wafer W is reduced by $NH_3$ gas. The chloride generated by the reduction reaction is removed from the chamber 2.

Further, the supply of $NH_3$ gas is stopped, and the remaining $NH_3$ gas in the chamber 2 is exhausted. At this time, e.g., $N_2$ gas may be supplied. In this manner, one cycle is completed at time t3.

Next, the same steps performed from time t1 to time t3 are repetitively executed. For example, the steps from time t1 to time t3 are repeated more than 10 cycles, preferably more than 30 cycles, until a desired TiN film can be obtained. The number of cycles is appropriately adjusted depending on a film thickness of a thin film formed as a result of one cycle.

Upon completion of the formation of the TiN film on the surface of the wafer W, the supply of both processing gases including $TiCl_4$ and $NH_3$ is stopped, and the chamber 2 is purged for a predetermined period of time. Then, $NH_3$ gas is supplied together with $N_2$ gas as carrier gas into the chamber 2, and a nitriding process is performed on the surface of the TiN film on the wafer W. In this manner, the film forming process is performed on a predetermined number of wafers W by repeating the same processes.

After the film forming process is performed on the predetermined number of wafers W, a cleaning process is carried out by supplying $ClF_3$ gas into the chamber 2 in order to remove unnecessary deposits adhered to the chamber 2.

In the film forming apparatus 1 described above, the cooling member 6 cooled by cooling gas is provided above the shower head 4, and the shower head heater 71 is disposed thereabove. Thus, the excessive increase of the temperature of the shower head 4 by heat radiated from a heating unit (not shown) of the chamber 2 or heat radiated from the wafer heater 32 in the processing space S is suppressed by the cooling operation of the cooling member 6 provided directly above the shower head 4. Further, the degree of the cooling operation can be adjusted by auxiliarily using the shower head heater 71 arranged above the cooling member 6. Accordingly, the temperature of the shower head surface facing the processing space S can be controlled with high accuracy. As a result, the process for forming a TiN film can be uniformly performed between wafers W.

In addition, a plurality of bosses 55 are provided on the top surface of the spacer unit 51, which is configured as the first gas diffusion space 52a of the processing gas, and a plurality of bosses 56 are provided on the bottom surface of the spacer unit 51, which is configured as the second diffusion space of the processing gas. Further, the bosses 55 contact with the base portion 41, and the bosses 56 contact with the shower plate 42. Accordingly, heat can be effectively transferred between the base portion 41 and the spacer unit 51 or between the spacer unit 51 and the shower plate 42. As a consequence, the temperatures of the spacer unit 51 and the surface of the shower plate 42 can be controlled to set temperatures with higher accuracy.

Besides, as for a cooling unit, instead of providing the cooling member 6, the gas discharge lines 64 and the like as in the above-described film forming apparatus, there may be employed a configuration in which a block having therein a gas chamber where cooling gas circulates is installed between the shower head 4 and the heater 71. Or, a cooling member formed by a peltier element may be used as a cooling unit.

Or, as for a cooling unit, a plate having on a surface thereof a channel through which cooling liquid flows may be provided on the shower head 4. However, the configuration of the above embodiment in which the cooling unit using cooling gas is provided is advantageous in that, since there is no need to provide a line through which cooling liquid flows, it is possible to increase a degree of freedom in layout of components forming the film forming apparatus 1 while suppressing the scaling-up of the apparatus. Further, the aforementioned embodiment has the configuration in which the cooling fins 62 are raised and the cooling gas flows in the gaps between the fins 62, so that it is possible to increase the surface area of the cooling member 6 exposed to the cooling gas and reduce the bottom area of the cooling member 6. Hence, the scaling up of the apparatus can be suppressed effectively.

In the aforementioned film forming process, films are laminated in multiple steps by repeating a cycle of introducing processing gas into the chamber 2 pulsely. However, a CVD film forming process for continuously supplying processing gas may be carried out. Further, a TiN film may be formed by alternately performing formation of a Ti atomic layer (or molecular layer) on the wafer W and nitriding by alternating the atmosphere in the processing space S between $TiCl_4$ gas and $NH_3$ gas multiple times by supplying $TiCl_4$ gas and $NH_3$ gas into the chamber 2 alternately, not simultaneously.

Furthermore, the film may be formed on the wafer W by using heat energy of the wafer heater 32 and energy of a plasma generated in the chamber 2 by a high frequency power applied to the shower head 4.

In the above-described embodiment, a film forming process of a TiN film has been described as an example. However, the film forming apparatus 1 may be applied to a CVD film forming process for forming another film such as a Ti film or the like.

Moreover, it may be noted that the present invention includes the gas supply device having the shower head 4 of the film forming apparatus 1, the cooling member 6 provided thereabove, the lines for supplying cooling gas to the corresponding cooling member 6, and the heater 71.

Further, the film forming apparatus of the present invention which includes the film forming apparatus 1, or the gas supply device is particularly suitable for a process, e.g. SFD, for increasing a temperature of the shower head 4 over a control target temperature by heat from the processing space, such as the stage heater or the like.

TEST EXAMPLE

Next, the following test examples and comparative examples were examined to check the effects of the present invention.

Figure 12:
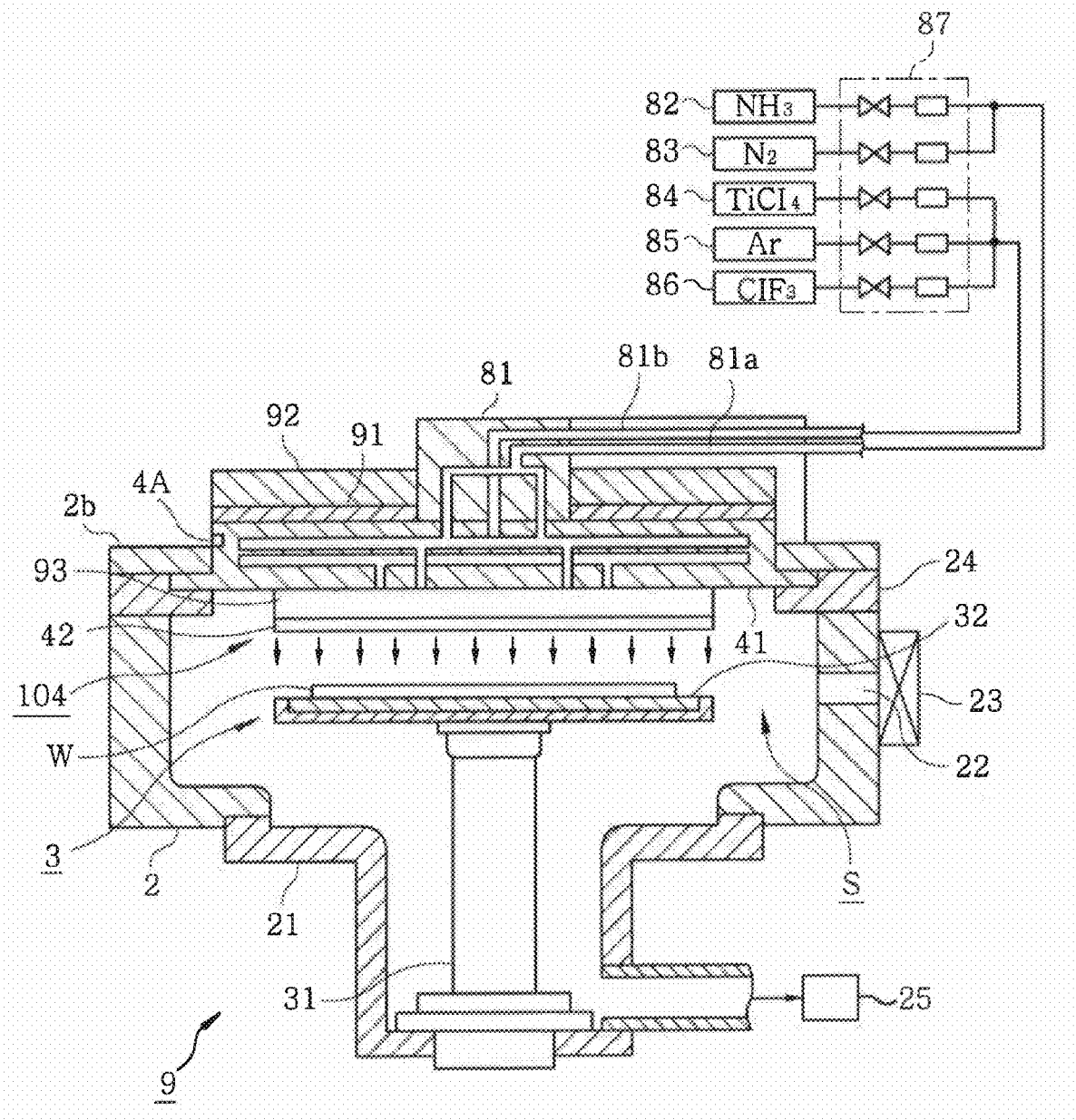
FIG. 12 presents a schematic cross sectional view of a conventional film forming apparatus used as a comparative example.

In the following test examples, the film forming apparatus 1 was used. Meanwhile, in the comparative examples, a conventional film forming apparatus 9 shown in FIG. 12 was used. Here, the film forming apparatus 9 has substantially the same configuration as that of the film forming apparatus 1, except for the following differences. In FIG. 12, like reference numerals will be used for like parts identical to those of the film forming apparatus 1. Although the control unit of the film forming apparatus 9 is not illustrated, the control unit of the film forming apparatus 9 controls the respective parts of the film forming apparatus 9 to thereby form a TiN film on the wafer W in the same manner as in the control unit 100.

The film forming apparatus 9 is different from the film forming apparatus 1 in that the cooling member 6, the cover 27 and the like are not arranged above the shower head 104. Instead, a heater 91 is stacked on the shower head 104. Moreover, a heat insulating member 92 is stacked on the heater 91.

Figure 13:
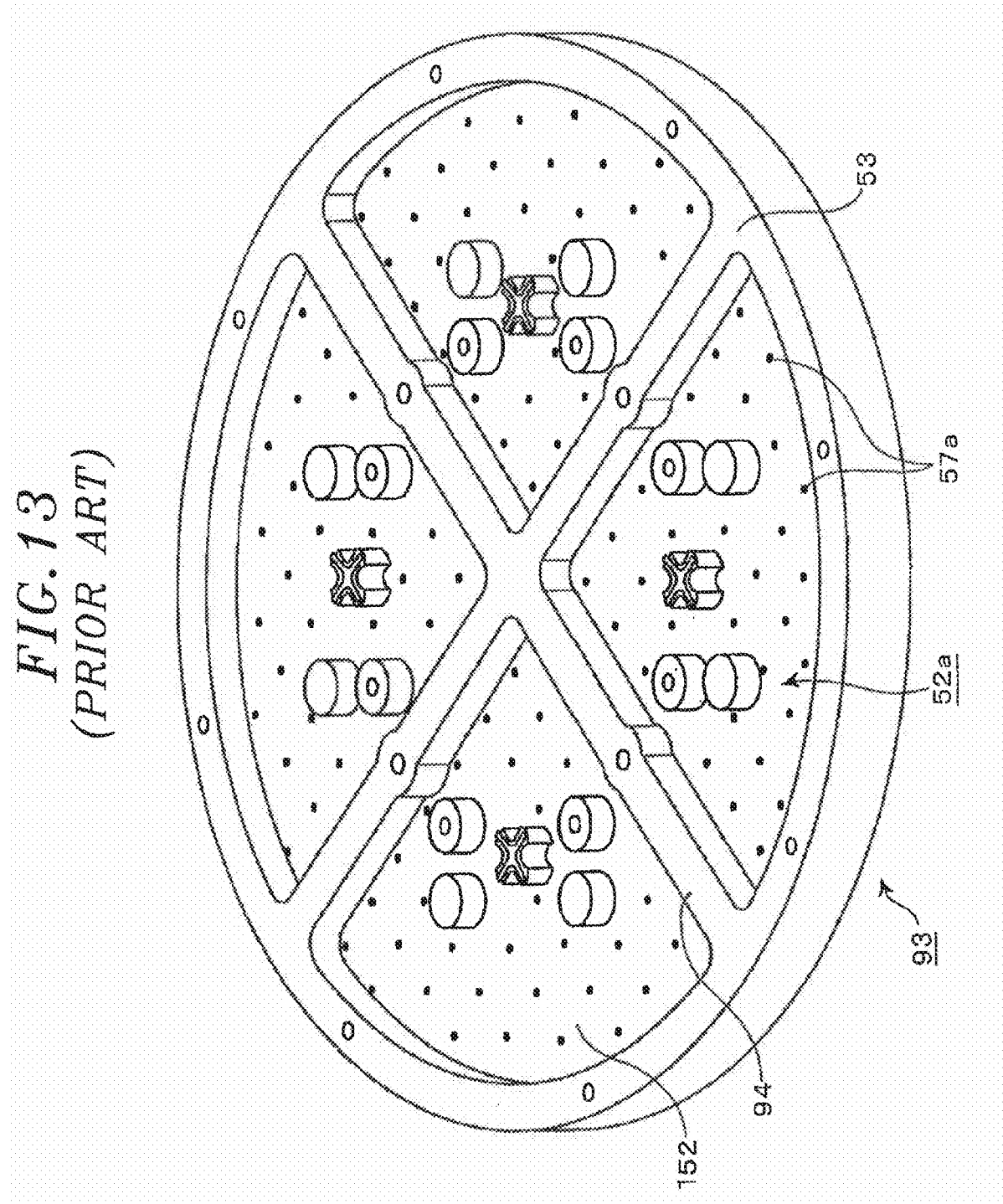
FIG. 13 represents a perspective view of a top surface of a spacer unit forming a shower head of the film forming apparatus shown in FIG. 12.

Furthermore, the shower head 104 of the film forming apparatus 9 has a spacer unit 93 having a conventional configuration, instead of the spacer unit 51 having the aforementioned configuration. The configuration of the spacer unit 93 will be described with reference to FIG. 13. FIG. 13 provides a perspective view showing a top surface of the spacer unit 93 included in the shower head 104 of the film forming apparatus 9 shown in FIG. 12. As shown in FIG. 13, bosses are not formed on the top surface of the circular plate portion 152 of the spacer unit 93. Instead, two ribs 94 perpendicular to each other are provided along the diameter direction of the circular plate portion 152. The top surfaces of the ribs 94 are firmly adhered to the bottom surface of the base portion 41. The diameter of the spacer unit 93 is about 340 mm, which is the same as that of the spacer unit 51. The total area where the spacer unit 93 comes in contact with the base portion 41 is about 276 $cm^2$. This occupies about 30% of an area of the spacer unit 93 projected onto the base portion 41, and is smaller than an area where the spacer unit 51 comes in contact with the base portion 41.

Test Example 1-1

A TiN film was formed on the wafer W by using the film forming apparatus 1 in accordance with the sequence described in the embodiment of the present invention. During the film forming process, the temperature of the heater 71 was set to about 165° C., and the flow rate of the cooling gas supplied from the cooling gas supply source 67 to the cooling member 6 was set to about 150 L/min. In addition, a temperature detecting sensor TC formed of a thermocouple was temporarily adhered to the surface of the shower head 4 (the surface facing the processing space S), so that it was possible to check the temperature of the shower head 4 detected by the temperature detecting sensor TC while varying the temperature of the wafer heater 32 of the stage 3.

Comparative Example 1-1

A TiN film was formed on the wafer W by using the film forming apparatus 9. During the film forming process, the temperature of the shower head 4 detected by the temperature detecting sensor TC adhered to the surface of the shower head 4 was checked while varying the set temperature of the wafer heater 32 of the stage 3. Here, the set temperature of the heater 91 on the shower head 104 was about 170° C.

Figure 14A:
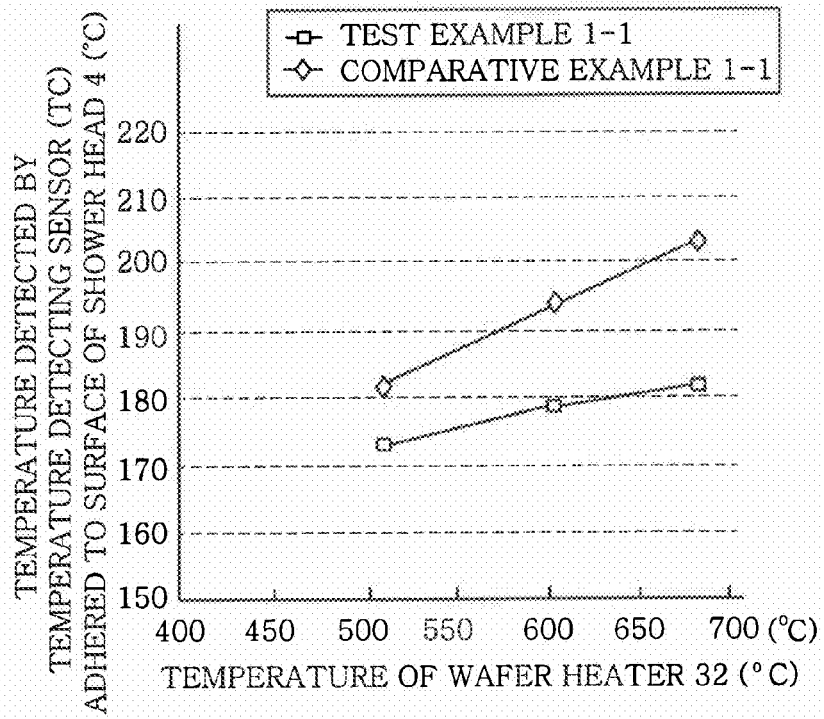
FIG. 14A describes a graph illustrating a temperature of a shower head that is not pre-coated during a film forming process using the conventional film forming apparatus and that during a film forming process using the film forming apparatus in accordance with the embodiment of the present invention.

FIG. 14A is a graph showing the results of the test example 1-1 and the comparative example 1-1. As shown in the graph of FIG. 14A, when the temperature of the heater 32 of the stage 3 is set high, the temperature detected by the temperature detecting sensor TC adhered to the surface of the shower head 104 sharply increases in the comparative example 1-1 compared to that in the test example 1-1. Therefore, it is seen from this graph that the surface temperature of the shower head 4 facing the processing space S in the test example 1-1 is suppressed compared to the surface temperature of the shower head 104 in the comparative example 1-1.

Moreover, the slope of the graph of the test example 1-1 is less steeper than that of the graph of the comparative example 1-1. From the above, it is clear that the temperature increase of the shower head is suppressed in the test example 1-1 compared to that in the comparative example 1-1.

Test Example 1-2

In the film forming apparatus 1, a TiN film was formed in advance (pre-coated) on the surface of the shower head 4 which faces the processing space S. In the test example 1-2, a TiN film was formed on the wafer W by using the film forming apparatus 1 in accordance with the sequence described in the embodiment of the present invention. Various processing conditions of the film forming process were the same as those of the test example 1-1. Besides, the temperature detecting sensor TC formed of a thermocouple was temporarily adhered to the surface of the shower head 4 (the surface facing the processing space S), so that it was possible to check the temperature of the shower head 4 detected by the temperature detecting sensor TC while varying the temperature of the wafer heater 32 of the stage 3.

Comparative Example 1-2

As in the test example 1-2, in the film forming apparatus 9, a TiN film was formed in advance (pre-coated) on the surface of the shower head 104 which faces the processing space S. A TiN film was formed on the wafer W by using the film forming apparatus 9. Various processing conditions of the film forming process were the same as those of the comparative example 1-1. Further, the temperature of the shower head 104 detected by the temperature detecting sensor TC adhered to the surface of the shower head 104 was checked while varying the set temperature of the wafer heater 32 of the stage 3.

Figure 14B:
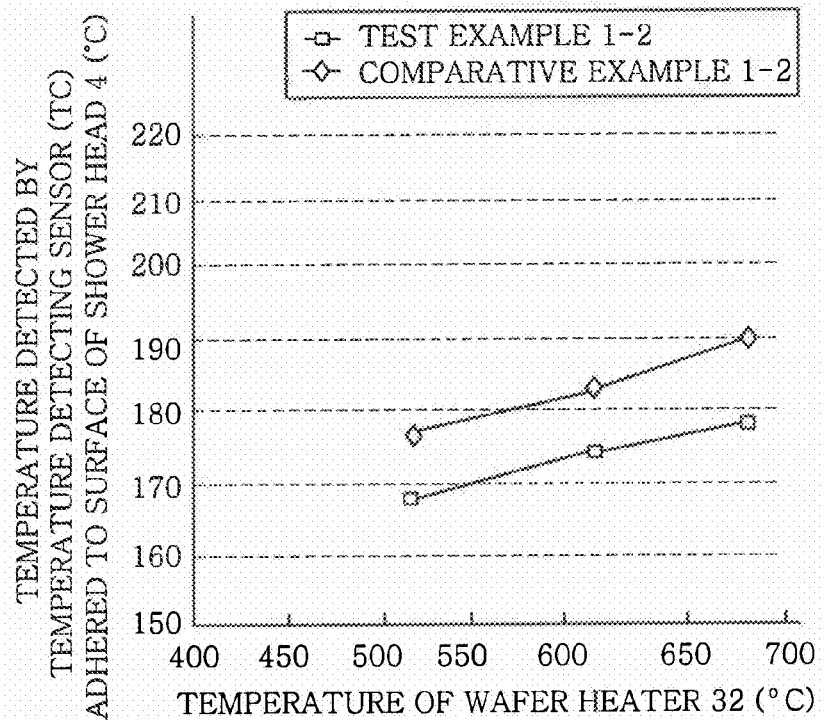
FIG. 14B is a graph showing a temperature of a pre-coated shower head during a film forming process using the conventional film forming apparatus and that during a film forming process using the film forming apparatus in accordance with the embodiment of the present invention.

FIG. 14B is a graph illustrating the results of the test example 1-2 and the comparative example 1-2. As can be seen from the graph of FIG. 14B, the temperature of the shower head 4 detected by the temperature detecting sensor TC is higher in the comparative example 1-2 than in the test example 1-2. Therefore, it is seen from this graph that the surface temperature of the shower head 4 in the test example 1-2 is suppressed compared to the surface temperature of the shower head 104 in the comparative example 1-2.

Moreover, in the temperature range of about 600 to 700° C. shown in the graph of FIG. 14B, the slope of the graph of the test example 1-2 is less steep than that of the comparative example 1-2. From the above, it is clear that the temperature increase of the shower head is suppressed in the test example 1-2 compared to that in the comparative example 1-2.

Test Example 2

In the test example 2, a TiN film was formed on 500 wafers W sequentially by using the aforementioned film forming apparatus 1 in accordance with the sequence described in the embodiment of the present invention. In this film forming process, the variation of the temperature of the shower head 4 detected by the temperature detecting sensor 4A and the power of the heater 71 on the shower head 4 were monitored. Further, the program of the control unit 100 was set to control the temperature of the heater 71 so that the temperature of the sensor 4A was maintained at about 165° C. during the film forming process.

Comparative Example 2

In the comparative example 2, a TiN film was formed on 500 wafers W sequentially by using the aforementioned film forming apparatus 9 in accordance with the sequence described in the embodiment of the present invention. In this film forming process, the variation of the temperature of the shower head 4 detected by the temperature detecting sensor (which is the same as the temperature detecting sensor 4A) and the power of the heater 91 on the shower head 104 were monitored. Furthermore, the program of the control unit of the film forming apparatus 9 was set to control the temperature of the heater 91 so that the temperature of the sensor was maintained at about 170° C. during the film forming process.

Figure 15A:
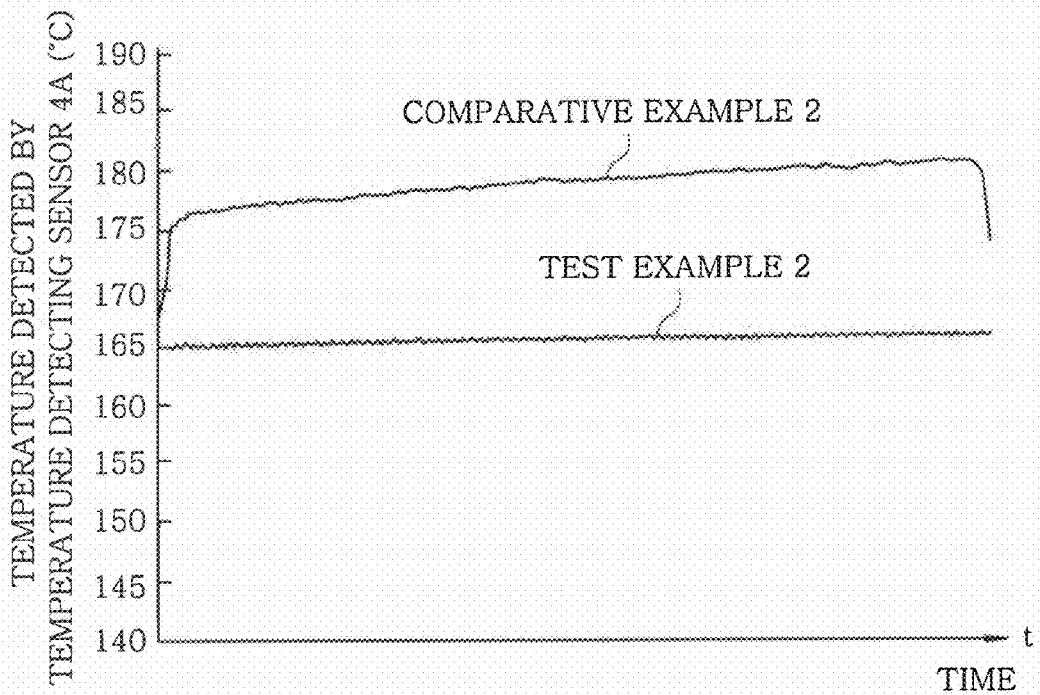
FIG. 15A shows a graph describing a temperature of a shower head of the conventional film forming apparatus and a temperature of a shower head of the film forming apparatus in accordance with the embodiment of the present invention.

FIG. 15A shows the temperatures monitored in the test example 2 and the comparative example 2. In the test example 2, the temperature was maintained at a preset level of about 165° C. On the other hand, in the comparative example 2, the temperature exceeded a set temperature of about 170° C. right after the start of the processing, and increased further as time elapses.

Figure 15B:
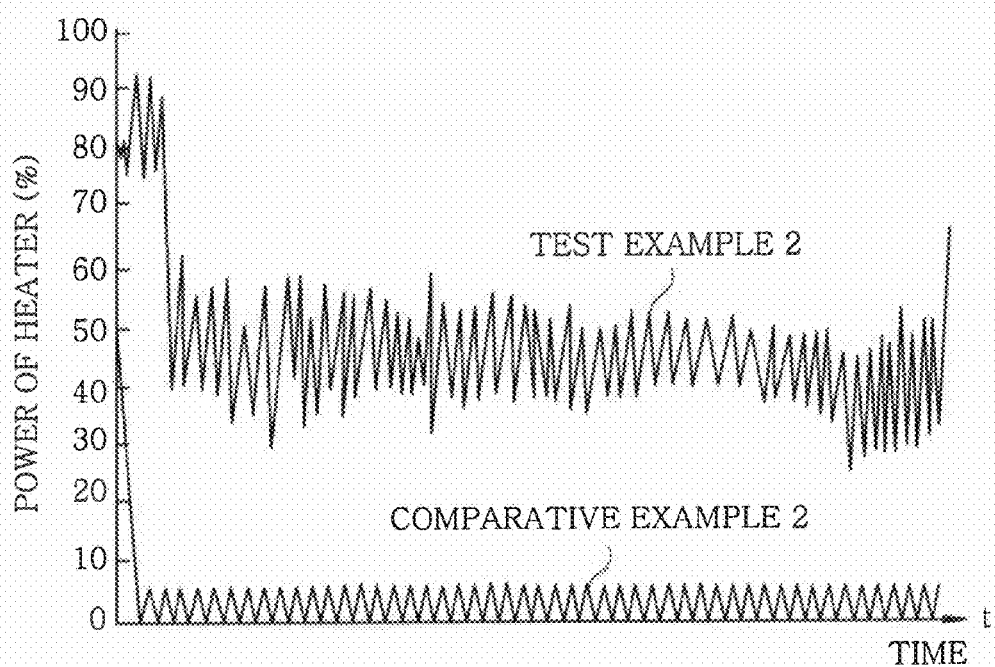
FIG. 15B sets forth a graph depicting a power of a heater of the conventional film forming apparatus and a power of a heater of the film forming method in accordance with the embodiment of the present invention.

FIG. 15B presents the power of the heater 71 of the test example 2 and the power of the heater 91 of the comparative example 2. Time indicated in a horizontal axis of the graph of FIG. 15B corresponds to time indicated in a horizontal axis of the graph of FIG. 15A. As illustrated in the graph of FIG. 15B, the power of the heater 71 of the test example 2 increased up to about 90% right after the start of the processing, and decreased to about 50%, and then became stable about 50%. On the other hand, in the comparative example 2, the power decreased to about 0% right after the start of the processing.

As can be seen from the graphs of FIGS. 15A and 15B, in the test example 2, it is found that the temperature of the shower head 4 can be stably controlled by the cooling member 6 and the heater 71. For this reason, the surface temperature of the shower head 4 which faces the processing space S is stably controlled so that it is possible to suppress the formation of a TiN film on the surface of the shower head 4. Meanwhile, in the comparative example 2, although the power of the heater 71 is zero, the temperature of the shower head 104 keeps increasing. Therefore, it is found that the temperature of the shower head 104 is not adequately controlled.

What is claimed is:
1. A film forming apparatus comprising:
    a chamber which defines a processing space in which a film forming process is performed on a substrate;
    a stage arranged in the chamber on which the substrate is mounted, the stage including a substrate heating unit that heats the substrate;
    a shower head which is arranged to face the stage and has a plurality of gas injecting holes;
    a gas supply unit that supplies a processing gas into the chamber through the shower head;
    a cooling unit arranged above the shower head that cools the shower head; and
    a shower head heating unit arranged above the cooling unit that heats the shower head through the cooling unit,
    wherein the cooling unit includes a plurality of cooling fins and a cooling gas supply channel that supplies cooling gas to the corresponding cooling fins.
2. The film forming apparatus of claim 1, wherein each of the cooling fins is raised and has a horizontally elongated plate shape, wherein the cooling fins are arranged in parallel, and wherein the cooling gas supply channel has gas discharge holes which open to allow cooling gas to pass from one end to the other end of a horizontally extending gap between the cooling fins.

3. The film forming apparatus of claim 1, wherein the cooling unit and the shower head heating unit are accommodated in a housing having a gas exhaust port.

4. The film forming apparatus of claim 1, wherein the shower head includes a gas diffusion space communicating with the gas injecting holes, and wherein a plurality of post portions that transfer heat between an upper side and a lower side of the shower head are disposed in the gas diffusion space.

5. The film forming apparatus of claim 1, further comprising:

a temperature detecting unit that detects a temperature of a bottom surface of the shower head;

and a control unit that controls the shower head heating unit based on a detected temperature value of the temperature detecting unit.

6. The film forming apparatus of claim 1, wherein the gas supply unit supplies a first and a second processing gas into the processing space simultaneously or separately in a plurality of cycles.

7. The film forming apparatus of claim 6, wherein the first processing gas is titanium compound gas, and the second processing gas is ammonia gas.

8. A gas supply device for use in a film forming apparatus including a chamber which defines a processing space for performing film forming process to a substrate and a stage arranged in the chamber for mounting the substrate thereon, the gas supply device comprising:

a shower head which is arranged to face the stage and has a plurality of gas injecting holes;

a cooling unit arranged above the shower head that cools the shower head; and a shower head heating unit arranged above the cooling unit that heats the shower head through the cooling unit, wherein the cooling unit includes a plurality of cooling fins and a cooling gas supply channel that supplies cooling gas to the corresponding cooling fins.

9. The gas supply unit of claim 8, wherein each of the cooling fins is raised and has a horizontally elongated plate shape, wherein the cooling fins are arranged in parallel and wherein the cooling gas supply channel has gas discharge holes which open to allow cooling gas to pass from one end to the other end of a horizontally extending gap between the cooling fins.

10. The gas supply device of claim 8, wherein the cooling unit and the shower head heating unit are accommodated in a housing having a gas exhaust port.

11. The gas supply device of claim 8, wherein the shower head includes a gas diffusion space communicating with the gas injecting holes, and wherein a plurality of post portions that transfer heat between an upper side and a lower side of the shower head are disposed in the gas diffusion space.

12. The gas supply device of claim 8, further comprising:

a temperature detecting unit that detects a temperature of a bottom surface of the shower head; and a control unit that controls the shower head heating unit based on a detected temperature value of the temperature detecting unit.

13. The film forming apparatus of claim 1, wherein the shower head heating unit generates heat.

14. The film forming apparatus of claim 1, wherein the shower head heating unit is a shower head heater.

15. The film forming apparatus of claim 1, wherein the shower head heating unit includes a first plate member that is disposed directly on the plurality of cooling fins.

16. The film forming apparatus of claim 1, wherein the shower head heating unit includes a first plate member and a second plate member, the first and second plate member sandwiching insulated rubber sheets, which rubber sheets have heating resistance disposed therebetween.

17. The gas supply device of claim 8, wherein the shower head heating unit generates heat.

18. The gas supply device of claim 8, wherein the shower head heating unit is a shower head heater.

19. The gas supply device of claim 8, wherein the shower head heating unit includes a first plate member that is disposed directly on the plurality of cooling fins.

20. The gas supply device of claim 8, wherein the shower head heating unit includes a first plate member and a second plate member, the first and second plate member sandwiching insulated rubber sheets, which rubber sheets have heating resistance disposed therebetween.

* * * * *